US010120045B2

(12) United States Patent
Yang et al.

(10) Patent No.: US 10,120,045 B2
(45) Date of Patent: Nov. 6, 2018

(54) MAGNETIC RESONANCE IMAGING (MRI) COIL WITH PIN DIODE DECOUPLING CIRCUIT

(71) Applicant: Quality Electrodynamics, LLC, Mayfield Village, OH (US)

(72) Inventors: Xiaoyu Yang, Indiana, PA (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 242 days.

(21) Appl. No.: 15/262,595

(22) Filed: Sep. 12, 2016

(65) Prior Publication Data

US 2018/0074140 A1  Mar. 15, 2018

(51) Int. Cl.
*G01V 3/00* (2006.01)
*G01R 33/36* (2006.01)
*G01R 33/34* (2006.01)
*G01R 33/30* (2006.01)
*G01R 33/341* (2006.01)

(52) U.S. Cl.
CPC ....... *G01R 33/3642* (2013.01); *G01R 33/307* (2013.01); *G01R 33/34* (2013.01); *G01R 33/341* (2013.01); *G01R 33/34069* (2013.01); *G01R 33/34076* (2013.01); *G01R 33/36* (2013.01); *G01R 33/365* (2013.01); *G01R 33/3607* (2013.01); *G01R 33/3614* (2013.01); *G01R 33/3621* (2013.01); *G01R 33/3628* (2013.01); *G01R 33/3635* (2013.01); *G01R 33/3657* (2013.01)

(58) Field of Classification Search
CPC ...... G01R 33/307; G01R 33/34; G01R 33/36; G01R 33/3607; G01R 33/3614; G01R 33/3621; G01R 33/3628; G01R 33/3635; G01R 33/3642; G01R 33/365; G01R 33/3657; G01R 33/3664; G01R 33/3671; G01R 33/3678; G01R 33/3685
USPC .................................................. 324/300–322
See application file for complete search history.

(56) References Cited

U.S. PATENT DOCUMENTS 4,620,155 A   10/1986  Edelstein
6,747,452 B1   6/2004  Jectic et al.
(Continued)

*Primary Examiner* — Jermele M Hollington
*Assistant Examiner* — Raul Rios Russo
(74) *Attorney, Agent, or Firm* — Eschweiler & Potashnik, LLC

(57) ABSTRACT

A magnetic resonance imaging (MRI) radio frequency (RF) coil comprising an LC circuit including at least one series capacitor, and a decoupling circuit connected in parallel to the LC circuit. The decoupling circuit is configured to decouple the MRI RF coil from one or more other MRI RF coils using passive decoupling upon the production of an induced voltage in the decoupling circuit, or to actively decouple the MRI RF coil from one or more other MRI RF coils upon the insertion of a DC bias into the decoupling circuit. The decoupling circuit includes a pair of fast switching PIN diodes including a first PIN diode connected anti-parallel with a second PIN diode, the second PIN diode connected in series with a first capacitor. The decoupling circuit further includes an inductor connected in series with the pair of fast switching PIN diodes and the capacitor.

25 Claims, 10 Drawing Sheets

(56) References Cited

U.S. PATENT DOCUMENTS

| | | | |
|---|---|---|---|
| 2008/0157762 A1* | 7/2008 | Weiss ............... | G01R 33/34046 324/304 |
| 2010/0039113 A1* | 2/2010 | Vartiovaara ........ | G01R 33/3657 324/322 |
| 2010/0079139 A1* | 4/2010 | DeFranco .......... | G01R 33/3657 324/307 |

* cited by examiner

MAGNETIC RESONANCE IMAGING (MRI) COIL WITH PIN DIODE DECOUPLING CIRCUIT

BACKGROUND

Magnetic resonance imaging (MRI) involves the transmission and receipt of radio frequency (RF) energy. RF energy may be transmitted by an RF coil. Resulting nuclear magnetic resonance (NMR) signals may also be received by an RF coil. In early MRI, RF energy may have been transmitted from a single RF coil and resulting NMR signals received by a single RF coil. Later, multiple receivers may have been used in parallel acquisition techniques. Similarly, multiple transmitters may have been used in parallel transmission techniques.

RF coils create the $B_1$ field that rotates the net magnetization in a pulse sequence. RF coils may also detect precessing transverse magnetization. Thus, RF coils may be transmit coils, receive coils, or transmit and receive (transmit/receive) coils. An RF coil may include, for example, an LC circuit. Typically, the transmitted RF signals are orders of magnitude larger than the MR signals generated by the excited nuclei and detected by the RF receive coils. Modern MRI apparatus may include multiple RF coils arranged in a receive array. An RF coil receive array may include hundreds or thousands of delicate electronic components. Damage to just one electronic component in the RF coil may cause the RF coil to no longer function in its optimized and expected way. To protect the receive coils and receiver circuits and apparatus, the receive coils may be decoupled or detuned while RF is being transmitted by an MR apparatus. Decoupling an RF coil reduces the current flowing through the RF coil. The decoupling or detuning may be active or passive. One approach to active decoupling involves, for example, applying a bias to a PIN diode semiconductor switch in conjunction with an LC circuit during RF transmission. Passive decoupling involves, for example, using antiparallel diode semiconductor switches in conjunction with LC circuitry. The antiparallel diode semiconductor switches are switched upon detecting high power RF transmit pulses, which allows high induced voltage generated from transmitting fields, but not low strength signals from nuclei, to interact with the parallel resonant LC circuit that decouples the coil.

An imaging coil needs to be able to resonate at a selected Larmor frequency. Imaging coils include inductive elements and capacitive elements. The resonant frequency, v, of an RF coil is determined by the inductance (L) and capacitance (C) of the inductor capacitor circuit (e.g. LC circuit) according to:

$$v = \frac{1}{2\Pi\sqrt{LC}}$$

Imaging coils may need to be tuned. Tuning an imaging coil may include varying the performance of a capacitor. Recall that frequency: $f=\omega/(2\pi)$, wavelength, $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

When MRI coils that are tuned to the same radio frequency are positioned close together, which may occur, for example, in phased array coils, the MRI coils may inductively couple to each other, which causes the MRI coils to detune each other. Detuning due to inductive coupling reduces image quality as compared to using single coils individually. Conventional phased array coils may address the detuning due to inductive coupling problem by overlapping coils or by using preamplifiers that dampen current flow in individual coils.

FIG. 1 illustrates a single RF coil segment 102 shown schematically to include an inductance 103, a resistance 104, and a capacitance 105. Capacitance 105 is selected to tune the segment 102 to a desired frequency (e.g., Larmor frequency). The RF coil segment 102 is connected across the output of a current control circuit 106 that is driven by an input signal 107 to produce a current in the RF coil segment 102. Unfortunately, an additional induced current may also flow through the RF coil segment 102 due to signals indicated at 108 induced by currents flowing in other (e.g., adjacent) RF coil segments. With multiple driving loops tuned at a single image frequency, which may occur in a phased array coil, the current on a loop is a superposition of the driven current and currents induced by other transmitters due to electromagnetic induction.

Conventional approaches to reduce, minimize, or eliminate the coupling through the mutual impedance in two interacting elements may have been attempted by cancelling the mutual impedance or by reducing the current in the coil. Mutual inductance may be cancelled by either partial overlap of adjacent coils, which may be referred to as transformer type decoupling, or by using decoupling capacitors. Other conventional approaches include using a preamplifier decoupling network to isolate coil elements by creating a large impedance block at the terminals of a receive element, which suppresses currents driven by the spin induced electromotive force (emf).

There are many design issues associated with MRI RF coil design. For example, the inductance of a conventional coil depends on the geometry of the coil. For a square coil with a side length a and wire diameter f: $L=[\mu_0/\pi]$ $[-4a+2a\sqrt{2}-2a\log(1+\sqrt{2})+2a\log(4a/f)]$. For a loop coil with loop diameter d and wire diameter f: $L=[\mu_0 d/2]$ $[\log(8d/f)-2]$. Thus, the selection of the geometry of a coil determines, at least in part, the inductance of the coil.

The resistance of a coil also depends on the geometry of the coil. The resistance R of a conductor of length l and cross-sectional area A is $R=\rho l/A$, where $\rho$ is the conductor resistivity and is a property of the conductor material and the temperature. For a copper wire coil with loop diameter d and wire diameter f: $R=d\rho_{Cu}/(f\delta_{Cu})$. For a copper foil coil with loop diameter d, copper thickness t, and copper width w: $R=\pi d\rho_{Cu}/(2w\delta_{Cu})$, where t is much greater than the copper skin depth and w is much greater than t. Thus, the selection of the geometry of a coil and the material (e.g., wire, foil) determines, at least in part, the inductance of the coil. The length of the loop also impacts the properties of the coil.

Coils may be characterized by their signal voltage, which is the electro-motive force (emf) induced in a coil: $\xi=-\partial\varphi/\partial t \propto -\partial(B_1 \cdot M_0)/\partial t$, where $\varphi$ is the magnetic flux across the coil (closed loop), magnetization $M_0=N\gamma^2(h/(2\pi))^2 s(s+1)B_0/(3k_B T_S)=\sigma_0 B_0/\mu_0$, where N is the number of nuclear spins s per unit volume (s=½ for protons) and $T_s$ is the temperature of the sample. Since $\omega_0=\gamma B_0$, $\xi \propto \omega_0^2$. The noise in a coil may be thermal (e.g., $v=(4k_B T_S R\Delta f)^{1/2}$, where R is the total resistance, $k_B$ is the Boltzmann constant, T is the temperature in K, and Δf is the bandwidth of the received signal). The signal to noise ratio (SNR) for a coil may be described by ξ/v.

Coils may be used for transmitting RF energy that is intended to cause nuclear magnetic resonance (NMR) in a sample. The frequency at which NMR will be created depends on the magnetic field present in the sample. Both the main magnetic field $B_0$ produced by the MRI apparatus and the additional magnetic field $B_1$ produced by a coil contribute to the magnetic field present in the sample. For a circular loop coil, the transmit $B_1$ field equals the coil sensitivity. A circular loop of radius a carrying a current I produces on axis the field: $B=\mu_0 I a^2/[2(a^2+z^2)^{3/2}]$.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 Tesla (T). The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

Conventional coils may use PIN diodes. When forward-biased, a PIN diode may produce a negligible resistance (e.g., 0.5Ω), which is effectively a short-circuit. When reverse-biased, a PIN diode may produce a high resistance (e.g., 200 kΩ) in parallel with a low capacitance (e.g., ~2 pF), which is essentially an open-circuit. RF coils may employ PIN diodes as part of detuning circuits that facilitate disabling a receive function of the RF coil while the RF coil is transmitting.

FIG. 2 illustrates a schematic of a simple conventional RF coil 200 for MRI. The coil 200 is illustrated as a loop 210. Loop 210 has elements that produce a resistance (R) (e.g., resistor 220) and that produce an inductance (L) (e.g., inductor 230). A conventional loop may include a matching capacitor 240 and tuning capacitor 250 that produce capacitance (C). The simple RF coil 200 may be referred to as an LC coil or as an RLC coil. Conventionally, the resistor 220, inductor 230, and capacitor 250 may all have been two-terminal passive elements that were soldered to copper wire or copper foil that was attached to a printed circuit board.

A resistor may be, for example, a passive, two-terminal electrical component that implements electrical resistance as a circuit element. Resistors reduce current flow. Resistors also lower voltage levels within circuits. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of capacitors, capacitors tend to contain at least two electrical conductors that are separated by a dielectric material. The conductors may be, for example, plates and the dielectric material may be, for example, an insulator. The conductors may be, for example, thin films of metal, aluminum foil or other materials. The non-conducting dielectric material increases the capacitor's charge capacity. The dielectric material may be, for example, glass, ceramic, plastic film, air, paper, mica, or other materials. Unlike a resistor, a capacitor does not dissipate energy. Instead, a capacitor stores energy in the form of an electrostatic field between its conductors.

When there is a potential difference across the conductors, an electric field may develop across the dielectric material. The electric field may cause positive charge (+Q) to collect on one conductor and negative charge (−Q) to collect on the other conductor.

FIG. 3 illustrates a schematic of another simple RF coil 300 for MRI. RF coil 300 may also be referred to as an LC coil or as an RLC coil. The RF coil 300 is illustrated as a square loop 310. Loop 310 has elements that produce a resistance (e.g., resistor 320) and elements that produce an inductance (e.g., inductor 330). A conventional loop may include a capacitor 340 and capacitor 350 that work together to achieve matching. The resistor 320, inductor 330, and capacitors 340 and 350 may have been soldered to copper wire or copper foil that was attached to a printed circuit board. RF coil 300 is contrasted with RF coil 200 (FIG. 2) that included capacitor 250 for tuning purposes.

FIG. 4 illustrates a conventional RF coil 400 that performs traditional "distributed" decoupling using components L1 and D1. RF coil 400 includes capacitors C1, C2, C3, and C4, and inductors L1 and L2. RF coil 400 includes a pre-amplifier circuit 410. Conventionally, pre-amplifier circuit 410 may be used as a pre-amplifier decoupling circuit. When the input impedance of the pre-amplifier circuit 410 becomes small (e.g. 0 to 2 Ohms) inductor L2 achieves a parallel resonant circuit with C3. The pre-amplifier, in conjunction with a coil matching/decoupling circuit, reduces the current flow in the RF coil. Reducing the current flow in the RF coil reduces the magnetic fields generated by the current flow, which would otherwise induce undesirable current flow in the neighboring or adjacent RF coils.

RF coil 400 also includes a PIN diode D1. Recall that a PIN diode has a wide, lightly doped near intrinsic semiconductor region positioned between a p-type semiconductor region and an n-type semiconductor region that are used for ohmic contacts. The wide intrinsic region makes the PIN diode suitable for fast switches. Fast switching may be employed in MRI coils. In transmit mode, the PIN diode D1 may be turned on (e.g., shorted).

In conventional RF coil 400, capacitors C1, C2, and C3 are illustrated to represent one or more capacitors that may be employed in the RF coil 400. Thus, capacitors C1-C3 may be an equivalent capacitor of multiple breaking point capacitors that may appear in RF coil 400 minus capacitor C4. The RF coil has an inductance. The inductance may be produced, for example, by a copper trace that forms the RF coil 400.

In the conventional RF coil 400, capacitor C4 may be the breaking point capacitor that is used for decoupling the RF coil 400 from other MRI coils. Capacitor C4 and inductor L1 are in parallel resonance and the impedance across capacitor C4 is high. Capacitor C4 is a single high impedance point in RF coil 400. Since the impedance across capacitor C4 is high, an induced voltage on RF coil 400 cannot generate a large current through capacitors C1, C2, or C3.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example embodiments described herein employ fast switching PIN diodes in an MRI RF coil decoupling/detuning circuit to actively decouple or passively decouple the RF coil. Example embodiments facilitate actively and passively decoupling an MRI RF coil from at least one other MRI RF coil. Example embodiments employ a pair of fast switching PIN diodes connected antiparallel to each other, a capacitor connected in series to one member of the pair of fast switching PIN diodes, and an inductor connected in series to the pair of fast switching PIN diodes and the capacitor in a decoupling circuit to facilitate switching speeds of up to 2 µs. Example embodiments actively decouple an MRI RF coil by injecting DC bias into the decoupling circuit, and passively decouple the MRI RF coil using induced voltage. Example embodiments thus facilitate faster switching between transmitting (Tx) mode and receiving (Rx) mode of an MRI apparatus. Example embodiments further facilitate faster MRI gradient switching speeds and the use of RF coils described herein with fast and ultra-fast MR imaging sequences that would not be obtainable with conventional decoupling approaches. Example methods and apparatus thus improve on conventional approaches by using fewer electrical components, by presenting a simpler circuit, and by facilitating faster switching of an MRI apparatus than conventional approaches that use active and passive coupling. Example methods and apparatus are thus cheaper, involve less complicated circuit designs, and are easier to produce and maintain, than conventional approaches.

Figure 1:
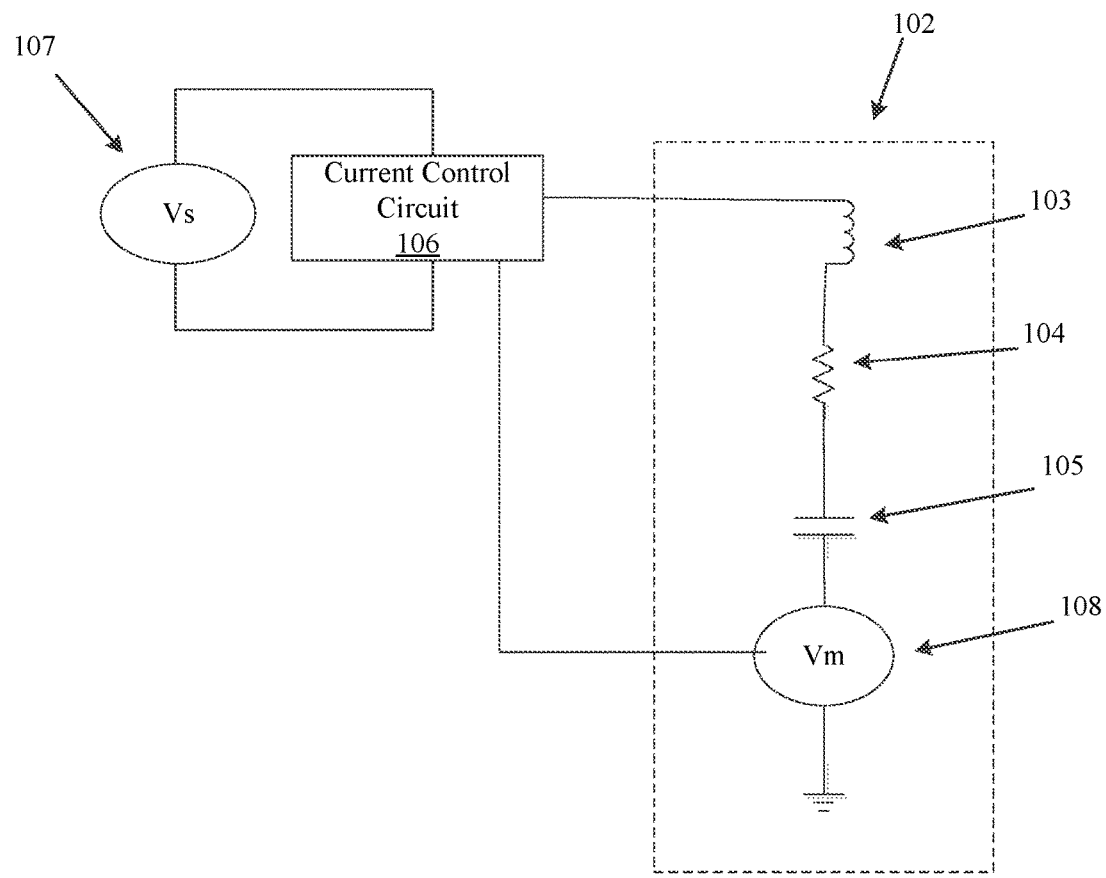
FIG. 1 illustrates a conventional RF coil for MRI that may experience inductive coupling.
Figure 2:
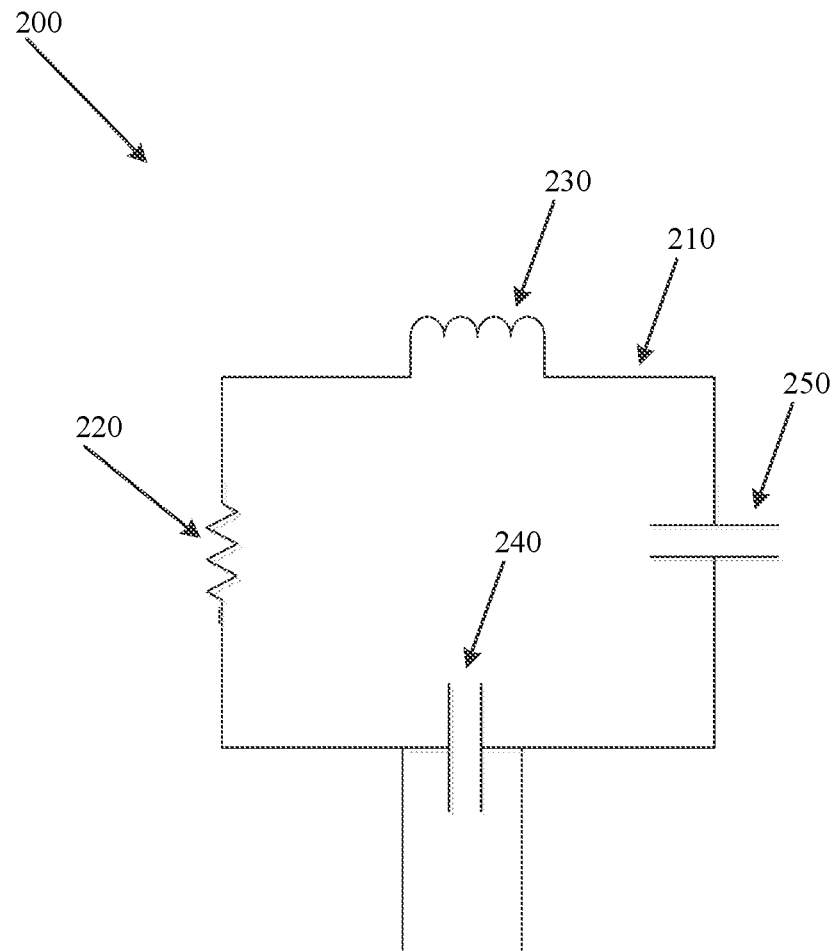
FIG. 2 illustrates portions of an RF coil for MRI.
Figure 3:
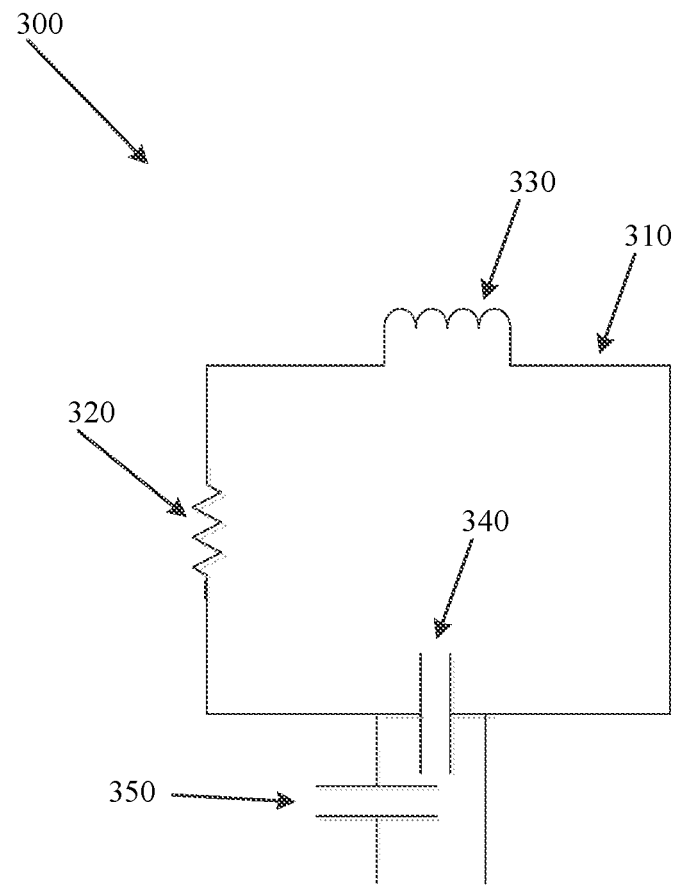
FIG. 3 illustrates portions of an RF coil for MRI.
Figure 4:
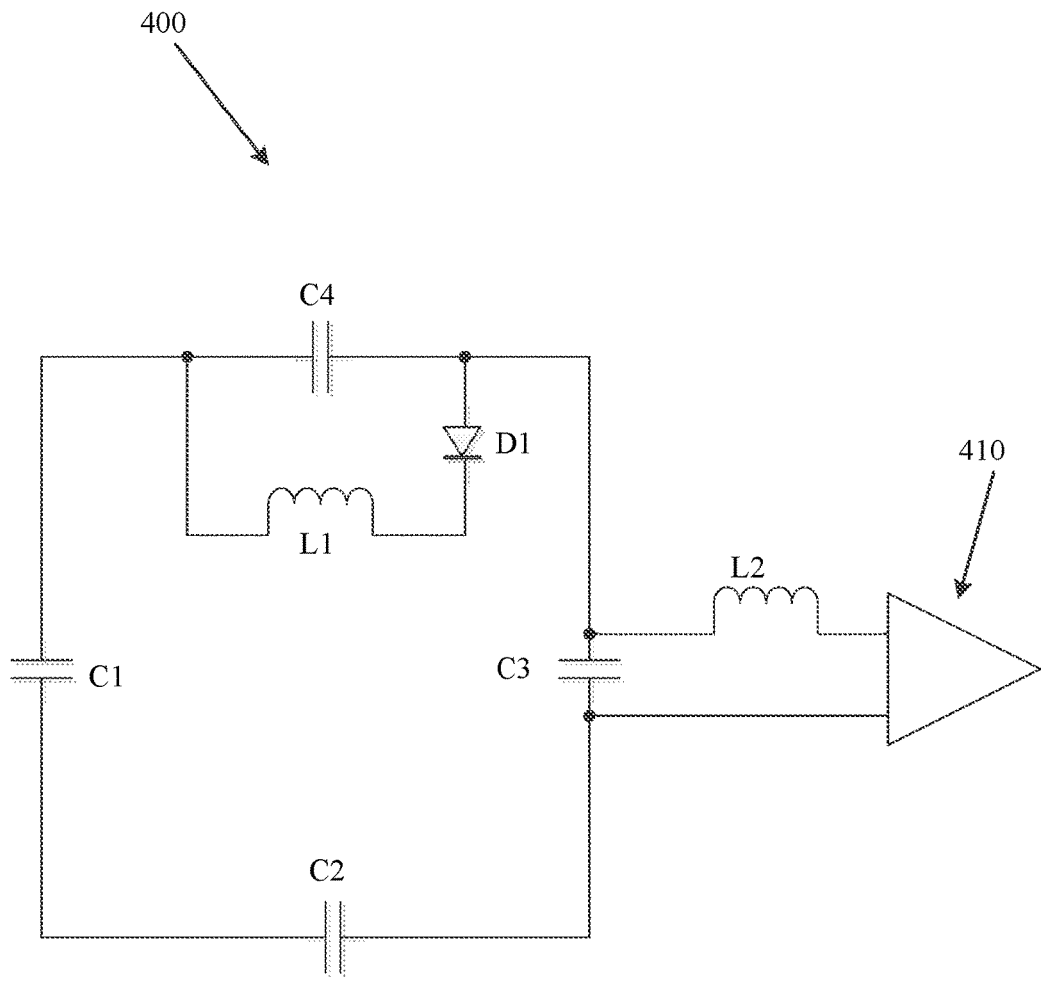
FIG. 4 illustrates an RF coil for MRI that performs conventional decoupling.
Figure 5:
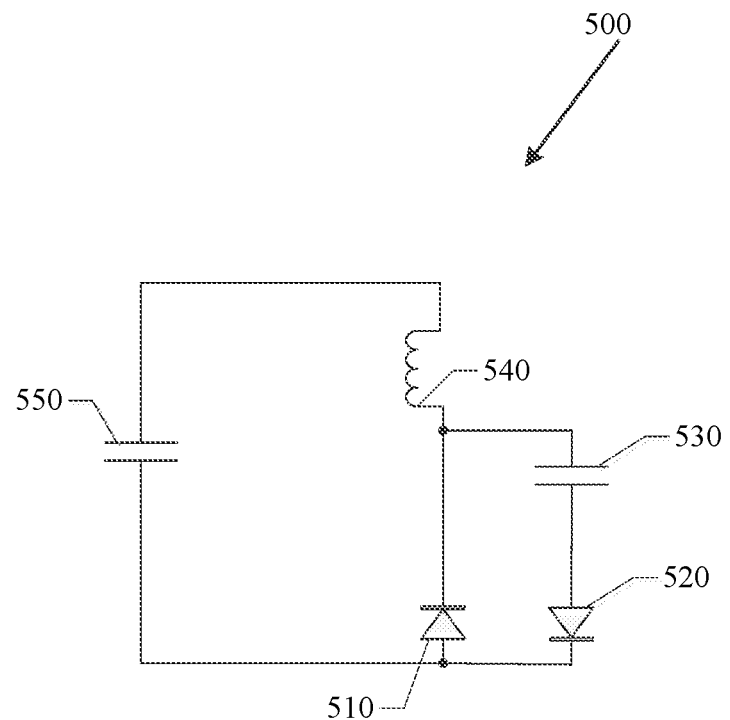
FIG. 5 illustrates an example decoupling circuit that performs active or passive decoupling.

FIG. 5 illustrates an example decoupling circuit 500. Decoupling circuit 500 may be implemented as part of an MRI RF coil or may be operably connected to an MRI RF coil. In one embodiment, decoupling circuit 500 is operably connected with an LC circuit including at least one series capacitor. Recall that an MRI RF coil is, at least in part, an LC circuit. In this example, the at least one series capacitor is represented by capacitor 550. The MRI RF coil with which decoupling circuit 500 is operably connected to or implemented as a part of may be configured to operate as a receive coil, a transmit coil, or as a receive and transmit (receive/transmit) coil.

Decoupling circuit 500 may be connected in parallel to the LC circuit or MRI RF coil across the at least one series capacitor 550. Decoupling circuit 500 may be connected to a plurality of MRI RF coils. Decoupling circuit 500 decouples the MRI RF coil or plurality of MRI RF coils from one or more other MRI RF coils using passive decoupling upon detection of an induced voltage within decoupling circuit 500 within a threshold range. The induced voltage is a function of, at least in part, the RF coil size. Decoupling circuit 500 is also configured to decouple the MRI RF coil from one or more other MRI RF coils using active decoupling.

Decoupling circuit 500 includes a pair of PIN diodes. The pair of PIN diodes includes a first PIN diode 510 operably connected with a second PIN diode 520. Decoupling circuit 500 further includes a first capacitor 530 operably connected with the pair of pin diodes. Decoupling circuit 500 further comprises an inductor operably connected with the pair of PIN diodes and the first capacitor. The first PIN diode 510 is connected antiparallel with the second PIN diode 520. The second PIN diode 520 is connected in series with the first capacitor 530. The inductor 540 is connected in series with the pair of PIN diodes and the first capacitor 530. Members of the pair of PIN diodes, including first PIN diode 510 and second PIN diode 520, are fast switching PIN diodes. In one embodiment, first PIN diode 510 or second PIN diode 520 has a carrier life time less than or equal to 100 ns. By using fast switching PIN diodes with carrier life times less than or equal to 100 ns, example embodiments described herein achieve switching speeds of less than 2 µs without the use of a discharging inductor, thus improving on conventional approaches. In another embodiment, PIN diodes with other, different carrier life times may be employed.

In one embodiment, first capacitor 530 is configured as a DC blocking capacitor. First capacitor 530 provides an effective short circuit in decoupling circuit 500 when exposed to a first RF signal at a first RF excitation frequency. The RF excitation frequency at which first capacitor 530 provides the effective short circuit may be a function of, at least in part, a type of tissue being imaged by the MRI system, a type of RF coil employed by the MRI system, or other parameter. The RF excitation frequency may be based on a tuning of decoupling circuit 500.

In one embodiment, inductor 540 is configured as a decoupling inductor. Inductor 540 resonates in parallel with the at least one series capacitor 550 when subjected to an NMR frequency within a threshold range. The NMR frequency may be, for example, a working frequency. The NMR frequency may be a function of the tissue being imaged. When inductor 540 resonates in parallel with the at least one series capacitor 550, their resonance generates an impedance across the at least one series capacitor 550. The impedance generated across the at least one series capacitor reduces the current flowing through the LC circuit, thus decoupling the RF coil. The current flowing through the LC circuit may be reduced a threshold amount sufficient to decouple the RF coil. Thus, in one embodiment, the pair of PIN diodes produces a conductive circuit element at voltages within a threshold voltage range. The threshold voltage range is greater than the voltage induced by an NMR signal, and lower than the voltage induced by the first RF excitation signal or frequency.

Conventional approaches to decoupling circuits that perform active and passive decoupling require a long carrier lifetime PIN diode, signal diodes connected antiparallel, and a fast switch circuit that employs at least one RF choke. Conventional approaches also employ a discharge inductor to further speed up the discharge of the long carrier lifetime PIN diode. The discharge inductor also increases the cost of conventional approaches. However, conventional approaches do not achieve switching speeds compatible with newer ultra-short echo time (UTE) sequences. Example embodiments improve on conventional approaches by employing at least two short carrier lifetime PIN diodes connected antiparallel, in conjunction with DC bias. In one embodiment, a decoupling circuit may be operably connected with an MRI transmit/receive coil that includes a transmit element and a receive element. The transmit element includes a first decoupling circuit, and the receive element includes a second, different decoupling LC circuit. In this example, the second different LC circuit associated with the receive element is decoupled using the LC circuit and the pair of antiparallel short carrier lifetime PIN diodes. The first decoupling circuit associated with the transmit element is decoupled using only the short carrier lifetime diodes. Thus the decoupling circuit may switch on or off the transmit element.

Circuits, apparatus, MRI RF coils, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

Figure 6:
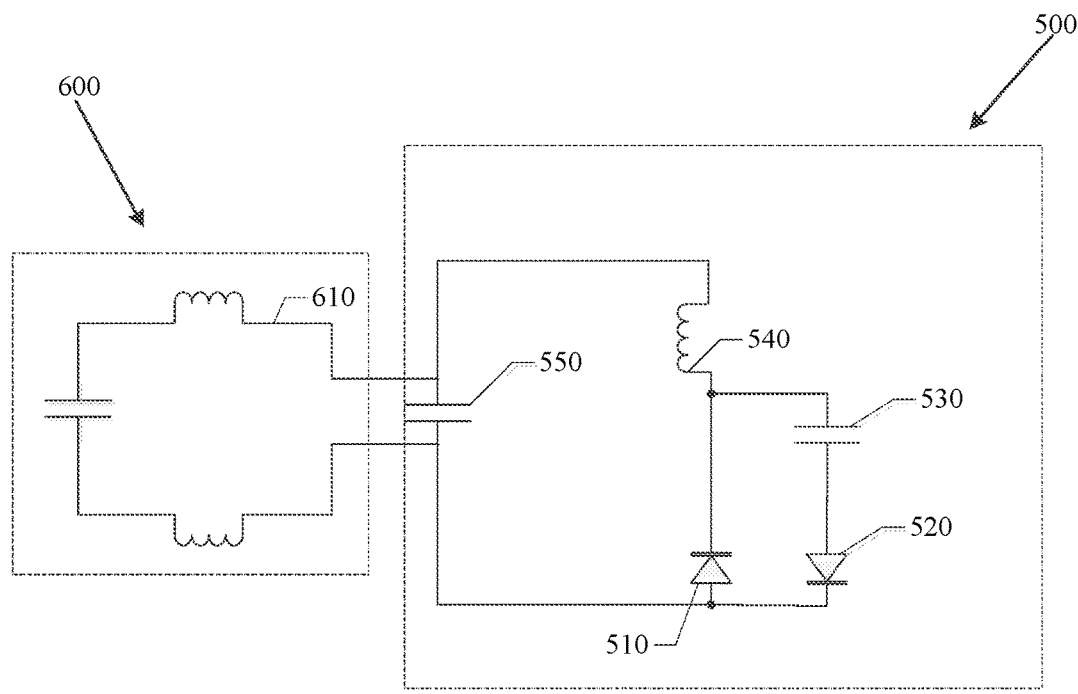
FIG. 6 illustrates an example MRI RF coil that includes a decoupling circuit that performs active or passive decoupling.

FIG. 6 illustrates an example MRI RF coil 600 that is operably connected with a decoupling circuit 500 that performs active or passive decoupling. FIG. 6 is similar to FIG. 5, but includes the additional elements of the MRI RF coil 600, which includes LC circuit 610. In the example illustrated in FIG. 6, LC circuit 610 is a simple loop coil. Example embodiments are not limited to implementation with just simple loop coils, but may be implemented with other configurations of LC circuits or MRI RF coils, such as a birdcage coil, a saddle coil, or other, different type of coil.

Figure 7:
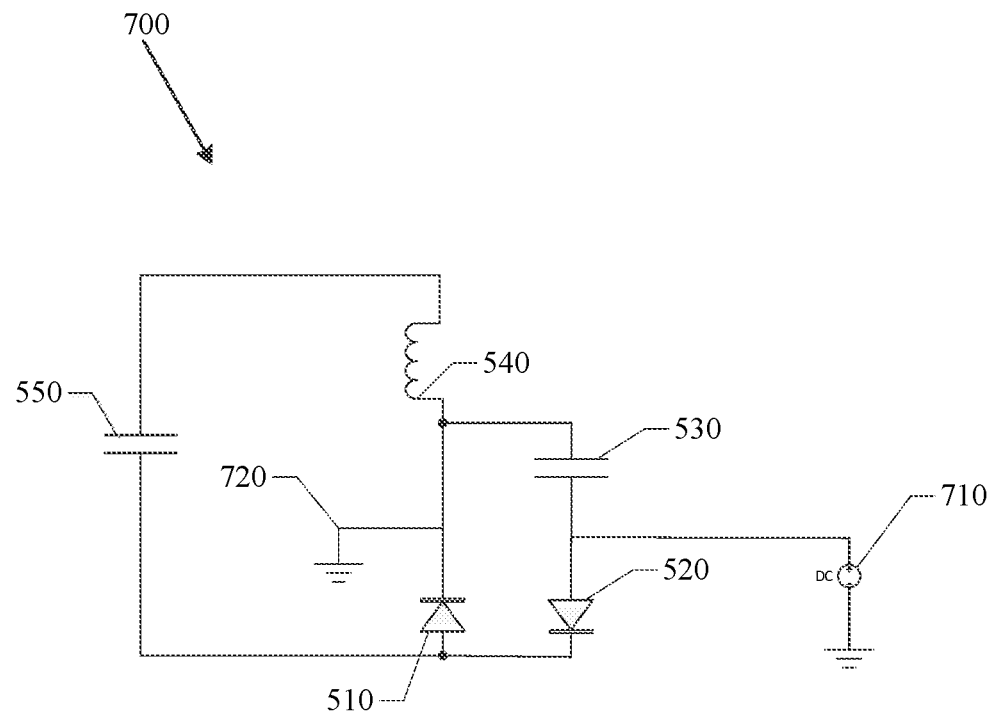
FIG. 7 illustrates an example decoupling circuit that performs active or passive decoupling.

Example embodiments facilitate actively decoupling and passively decoupling an MRI RF coil. FIG. 7 illustrates a decoupling circuit 700 that is similar to decoupling circuit 500 illustrated in FIG. 5 and FIG. 6. FIG. 7 includes additional elements DC bias source 710 and DC bias drain 720. In one embodiment, an MRI RF coil operably connected to decoupling circuit 700 is actively decoupled from one or more other MRI RF coils by injecting DC bias into the decoupling circuit 700. In one embodiment, the DC bias is injected into the decoupling circuit 700 between first capacitor 530 and the second PIN diode 520 by DC bias source 710. In this embodiment, the first capacitor 530 is configured as a DC blocking capacitor, and blocks the injected DC bias. The DC bias may be discharged from the decoupling circuit from between the first PIN diode 510 and the inductor 540 by DC bias drain 720. DC bias drain 720 may, in one embodiment, be a ground. In other embodiments, other arrangements of DC bias source 710 or DC bias drain 720 may be employed. In other embodiments, other elements of decoupling circuit 500 may be arranged differently. For example, in one embodiment, the second PIN diode 520 and the first capacitor 530 may be connected in parallel, while the first PIN diode 510 and the second PIN diode 520 remain connected antiparallel. In this example, the second PIN diode 520 and the first capacitor 530 are connected in parallel with respect to DC bias, while the first PIN diode 510 and the second PIN diode 520 remain connected antiparallel with respect to RF. In one embodiment, the DC bias may have a value of 50 mA. In another embodiment, the DC bias may have a value of less than 50 mA, for example, 10 mA. Other values of DC bias may be employed. In one embodiment, one PIN diode is always in a self-biased condition because an RF signal has a positive and a negative cycle and because the first PIN diode 510 and the second PIN diode 520 are in an antiparallel configuration. Thus, one of first PIN diode 510 or second PIN diode 520 is aligned with the RF current and the other of first PIN diode 510 or second PIN diode 520 is consequently aligned against the RF current. The injected DC bias thus functions as a switch signal.

Figure 10:
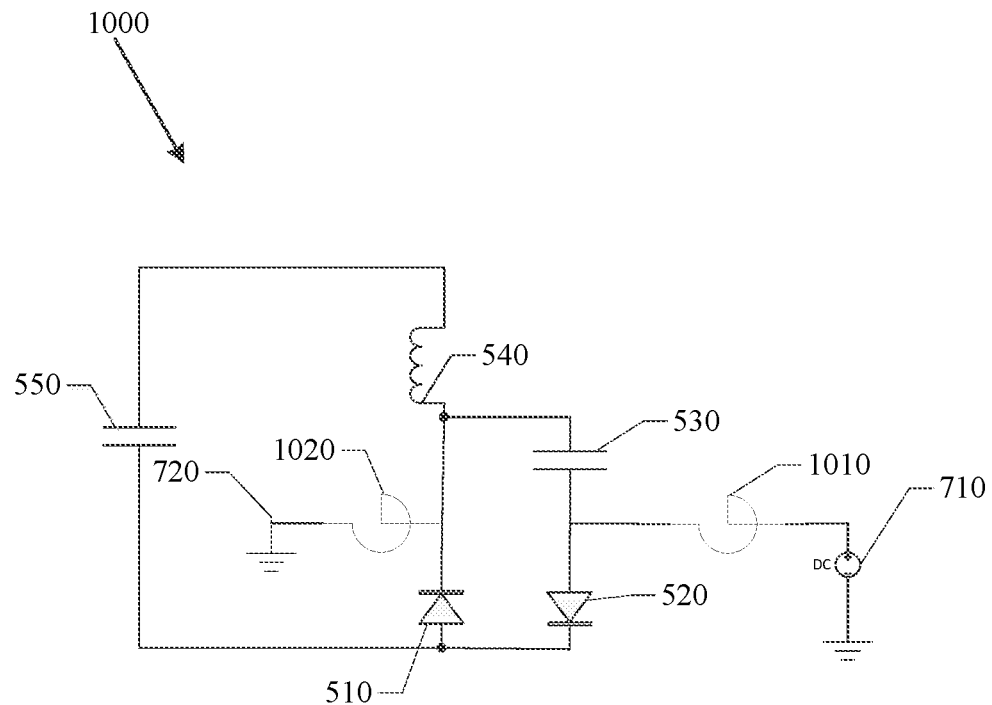
FIG. 10 illustrates an example decoupling circuit that performs active or passive decoupling.

FIG. 10 illustrates a decoupling circuit 1000 that is similar to decoupling circuit 700 illustrated in FIG. 7. Decoupling circuit 1000 includes additional elements 1010 and 1020. Decoupling circuit 1000 includes a first choke 1010. First choke 1010 is operably connected in series with DC bias source 710 and a first node located between second PIN diode 520 and first capacitor 530. Decoupling circuit 1000 also includes a second choke 1020. Second choke 1020 is operably connected in series with DC bias drain 720 and a second node located between first PIN diode 510 and inductor 540. In one embodiment, first choke 1010 and second choke 1020 may be RF chokes (RFC). First choke 1010 or second choke 1020 may be configured as inductors to block RF signals while allowing DC to flow. Thus, first choke 1010 and second choke 1020 permit DC to flow through first choke 1010 or second choke 1020, but demonstrate high impedance to RF signals.

In conventional transmit (Tx) coils, a single PIN diode may be used to turn on or turn off the Tx coil for decoupling. In a conventional Tx coil using a single PIN diode, the PIN diode must have a long carrier life time and a large DC current to ensure the PIN diode does not become saturated. For example, conventional approaches may require DC currents of 500 mA or more, depending on the magnetic field. This limits the switching speed with which such a conventional Tx coil may be effectively employed in clinically relevant situations. In a clinical environment, a Tx coil may be unplugged from the associated MRI system and left inside the system (e.g. on the patient inside the magnet bore). If the MRI system's whole body coil is run while the Tx coil is left unplugged in the system, the PIN diode may be damaged due to saturation. One conventional decoupling approach uses a pair of cross signal diodes to protect the PIN diode in the unplugged situation. Example embodiments improve on conventional approaches by employing two short carrier lifetime fast switching PIN diodes instead of the three diodes required by conventional approaches. Example embodiments further improve on conventional approaches by employing smaller DC bias currents than conventional approaches. In an active decoupling situation, example embodiments using the pair of fast switching PIN diodes connected antiparallel facilitate reducing the risk of diode saturation because of the antiparallel circuit arrangement. Saturation would only occur when RF current is opposite to the DC bias. Example embodiments employing a pair of fast switching PIN diodes connected antiparallel may be configured in a circuit arrangement in which there is always one fast switching PIN diode which has its DC bias aligned with RF current and that functions as an effective short. Therefore, the other fast switching PIN diode is aligned against RF current and is protected from saturation. If there is no DC bias present, such as occurs in an unplugged situation, the antiparallel fast switching PIN diodes will function like RF limiter diodes to protect themselves from saturation.

Example embodiments may be implemented as part of an MRI transmit/receive coil configured to operate in a transmit mode or a receive mode. For example, the MRI transmit/receive coil may include a receive element, a transmit element operably connected to the receive element, and a decoupling circuit operably connected to the transmit element. The receive element may include an LC circuit and a PIN diode configured to operate as a resonant circuit that creates a high impedance in the receive element, thus decoupling the receive element from the transmit element when the MRI transmit/receive coil is operating in transmit mode. Recall that a transmit/receive coil may be configured so that the transmit element will be disabled such that the transmit element does not couple with the receive element during receive mode. The decoupling circuit includes a first fast switching PIN diode connected antiparallel with a second fast switching PIN diode. The first fast switching PIN diode and the second fast switching PIN diode have diode carrier life times of less than or equal to 100 ns. The decoupling circuit also includes at least one DC blocking capacitor. The at least one DC blocking capacitor is connected in series or connected in parallel with the second fast switching PIN diode. The decoupling circuit may be configured to receive a DC bias injection during receive mode. The DC bias injection is aligned opposite to one of the first fast switching PIN diode or the second fast switching PIN diode. Upon injection of the DC bias into the decoupling circuit, the decoupling circuit actively decouples the transmit element.

Figure 8:
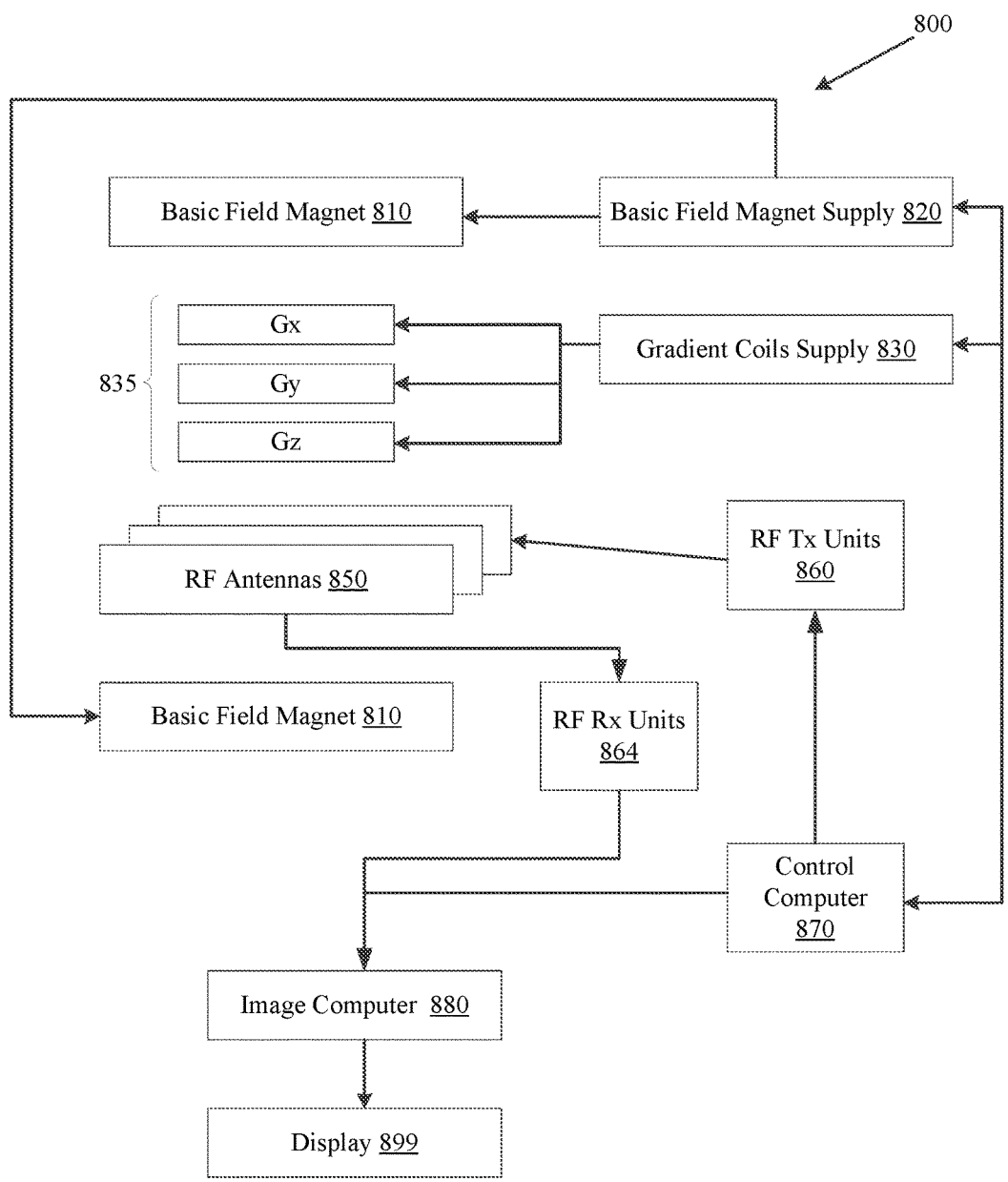
FIG. 8 illustrates an MRI apparatus configured with an example MRI RF coil that performs active or passive decoupling.

FIG. 8 illustrates an example MRI apparatus 800 configured with a set of example MRI RF coils including or operably connected to decoupling circuits as described herein. MRI apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 835 configured to emit gradient magnetic fields like $G_S$, $G_P$ and $G_R$. The gradient coils 835 may be controlled, at least in part, by a gradient coils supply 830. In some examples, the timing, strength, and orientation of the gradient magnetic fields may be controlled and thus selectively adapted during an MRI procedure.

MRI apparatus 800 may include a set of MRI RF antennas 850. Members of the set of MRI RF antennas 850 may include decoupling circuits or be operably connected to decoupling circuits as described herein. For example, a member of the set of MRI RF antennas 850 may be operably connected to decoupling circuit 500, 700, or 1000. The decoupling circuits are configured to provide active decoupling and passive decoupling. A decoupling circuit may provide active decoupling upon the insertion of a DC bias to the decoupling circuit. A member of the set of MRI RF antennas 850 may be an MRI RF coil as described herein. A member of the set of MRI RF antennas 850 participates in the acquisition of MR data by transmitting RF signals into an examination subject (e.g. a patient, a phantom) or by receiving MR signals from the examination subject. The set of MRI RF antennas 850 may include a plurality of receive MRI RF antennas, a plurality of transmit MRI RF antennas, or a plurality of transmit/receive MRI RF antennas that are configured to generate RF pulses or excitation signals and/or to receive resulting magnetic resonance (e.g. NMR) signals from an object or region (e.g. tissue being imaged) to which the RF pulses are directed. The RF antennas 850 may be controlled, at least in part, by a set of RF transmission units 860. An RF transmission unit 860 may provide a control signal, a voltage, or a current, to a member of the set of RF antennas 850. The control signal, the voltage, or the current may cause an MRI RF coil associated with a member of the set of RF antennas 850 to resonate at a desired transmission frequency. In one embodiment, members of the set of RF antennas 850 may employ a decoupling circuit that includes a pair of fast switching PIN diodes connected antiparallel, a DC blocking capacitor connected in series with a member of the pair of fast switching PIN diodes, and an inductor connected in series with the pair of fast switching PIN diodes and the capacitor, like the decoupling circuits 500, 700, and 1000 described herein. In one embodiment, the DC blocking capacitor may be connected in parallel with a member of the pair of fast switching PIN diodes. In another embodiment, a plurality of DC blocking capacitors may be connected in parallel or in series with a member of the pair of fast switching diodes.

The gradient coils supply 830 and the RF transmission units 860 may be controlled, at least in part, by a control computer 870. The MR signals received from the RF antennas 850 may be received by RF Rx units 864. The MR signals received from the RF antennas 850 can be employed to generate an image, and thus may be subject to a transformation process like a two dimensional fast Fourier transform (FFT) that generates pixilated image data. The transformation can be performed by an image computer 880 or other similar processing device. The image data may then be shown on a display 899. While FIG. 8 illustrates an example MRI apparatus 800 that includes various components connected in various ways, it is to be appreciated that other MRI apparatus may include other components connected in other ways. In one example, MRI apparatus 800 may include control computer 870. In one example, a member of the set of RF antennas 850 may be individually controllable by the control computer 870.

Figure 9:
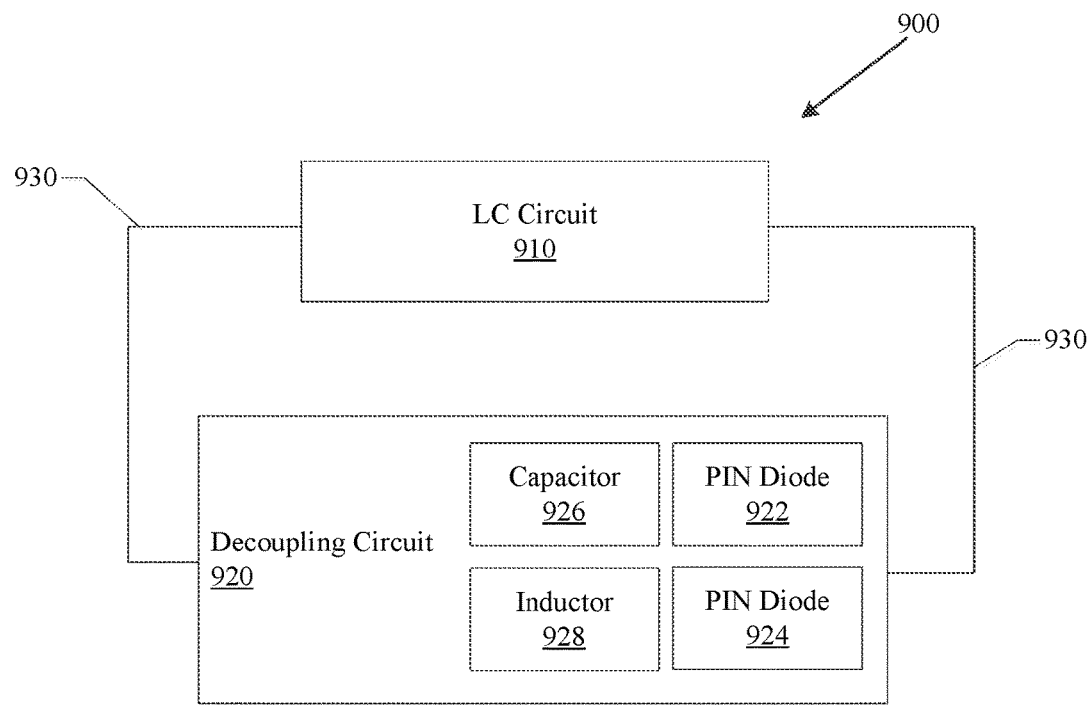
FIG. 9 illustrates a circuit for actively decoupling or passively decoupling an RF coil used in an MRI system.

FIG. 9 illustrates an example MRI coil 900 that includes an LC circuit 910 and that performs active or passive decoupling using a decoupling circuit 920 that includes a fast switching PIN diode 922, a fast switching PIN diode 924, a capacitor 926, and an inductor 928. Decoupling circuit 920 includes a wire or other conductor 930 that attaches to the LC circuit 910 at two points, thus connecting the decoupling circuit 920 with the LC circuit 910 in parallel. In one embodiment, the fast switching PIN diode 922 and fast switching PIN diode 924 are connected anti-parallel. Capacitor 926 is connected in series with fast switching PIN diode 924. Inductor 928 is connected in series with capacitor 926 and fast switching PIN diode 922 and fast switching PIN diode 924. In one embodiment, the fast switching PIN diode 922 and fast switching PIN diode 924 have carrier lifetimes of less than 100 ns. Capacitor 926 may be configured as a DC blocking capacitor that forms an effective short circuit at a first RF excitation frequency. In one embodiment, capacitor 926 is connected in parallel with fast switching PIN diode 924. In another embodiment, a plurality of capacitors is connected in parallel or in series with fast switching PIN diode 924.

MRI coil 900 may be, for example, a receive coil, a transmit coil, or a receive/transmit coil. Thus, fast switching PIN diode 922 or fast switching PIN diode 924 may be driven to different states to selectively block RF current from flowing through the LC coil 910. For example, during RF transmission fast switching PIN diode 922 or fast switching PIN diode 924 may be driven to a state that isolates the decoupling circuit 920 from the LC coil 910 to block RF current from flowing through the LC coil 910. More generally, the fast switching PIN diode 922 or fast switching PIN diode 924 may be driven to a first state when the RF coil 900 is transmitting RF energy, where the first state blocks current from flowing through the LC circuit 910. Additionally, the fast switching PIN diode 922 or fast switching PIN diode 924 may be driven to a second different state when the MRI coil 900 is not transmitting RF energy, where the second state allows current to flow through the LC coil 910. In one embodiment, fast switching PIN diode 922 or fast switching PIN diode 924 are driven to the first state upon injection of a DC bias to the decoupling circuit 920.

MRI coil 900 may be one of a plurality of receive, transmit, or receive/transmit coils in an MRI apparatus. For example, MRI coil 900 may be implemented as part of RF antennas 850 illustrated in FIG. 8. Thus, the decoupling circuit 920 selectively decouples the MRI RF coil 900 from one or more other MRI RF coils associated with the MRI apparatus. To maintain the decoupling function, elements of the LC circuit 910 and elements of the decoupling circuit 920 produce a reactance through the conductor of the decoupling circuit 920. The reactance is sufficient to prevent self-cancelling between elements of the LC circuit 910 and elements of the decoupling circuit 920. To maintain decoupling, decoupling circuit 920 will generate an impedance that is high enough so that no large current can flow through LC circuit 910 and decoupling circuit 920. A large current may include a current that is sufficient to damage a component of MRI coil 900, or an MRI apparatus associated with MRI coil 900, or that is larger than a threshold value.

While FIG. 9 illustrates an example MRI coil 900 that includes various components connected in various ways, it is to be appreciated that other MRI coils may include other components connected in other ways.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the above description some components may be displayed in multiple figures carrying the same reference signs, but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example circuits, apparatus, systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A magnetic resonance imaging (MRI) radio frequency (RF) coil, comprising:
    an LC circuit including at least one series capacitor; and
    a decoupling circuit connected in parallel to the LC circuit across the at least one series capacitor, the decoupling circuit configured to decouple the MRI RF coil from one or more other MRI RF coils using passive decoupling upon detection of an induced voltage, or to decouple the MRI RF coil from the one or more other MRI RF coils using active decoupling, where the decoupling circuit comprises:
        a pair of PIN diodes comprising a first PIN diode operably connected with a second PIN diode;
        a first capacitor operably connected with the pair of pin diodes; and
        an inductor operably connected in series with the pair of PIN diodes and the first capacitor, where the second PIN diode is connected in series with the first capacitor, where the first PIN diode is connected in parallel with the second PIN diode and the first capacitor, and where the second PIN diode and the first PIN diode are antiparallel.

2. The MRI RF coil of claim 1, where the first PIN diode and the second PIN diode are fast switching PIN diodes.

3. The MRI RF coil of claim 2, where the first PIN diode and the second PIN diode have a carrier life time less than or equal to 100 ns.

4. The MRI RF coil of claim 1, where the first capacitor is configured as a DC blocking capacitor, where the first capacitor provides an effective short circuit at a first RF excitation frequency.

5. The MRI RF coil of claim 4, where the inductor is configured as a decoupling inductor, where the inductor resonates in parallel with the at least one series capacitor when subjected to an NMR frequency, where the inductor resonating in parallel with the at least one series capacitor generates an impedance across the at least one series capacitor, where the impedance reduces a current flowing through the LC circuit by a threshold amount.

6. The MRI RF coil of claim 1, where the decoupling circuit further comprises a DC bias source operably connected to a first node located between the second PIN diode and the first capacitor, where the DC bias source is configured to inject a DC bias into the decoupling circuit at the first node, where the decoupling circuit actively decouples the MRI RF coil from the one or more other MRI RF coils upon injection of DC bias into the decoupling circuit.

7. The MRI RF coil of claim 6, where the first capacitor blocks the DC bias.

8. The MRI RF coil of claim 7, where the decoupling circuit further comprises a DC bias drain operably connected to a second node located between the first PIN diode and the inductor, where the DC bias drain is configured to discharge the DC bias from the decoupling circuit.

9. The MRI RF coil of claim 7, where the pair of PIN diodes produces a conductive circuit element at voltages within a threshold voltage range, where the threshold voltage range is greater than the voltage induced by an NMR signal, and lower than the voltage induced by a first RF excitation signal.

10. The MRI RF coil of claim 1, where the MRI RF coil is a birdcage coil.

11. The MRI RF coil of claim 1, where the MRI RF coil is a quadrature phased array coil.

12. The MRI RF coil of claim 1, where the MRI RF coil is a saddle coil.

13. The MRI RF coil of claim 1, where the MRI RF coil is a receive coil, a transmit coil, or a receive and transmit coil.

14. The MRI RF coil of claim 1, where the decoupling circuit further comprises a plurality of capacitors, where the first capacitor is a member of the plurality of capacitors, where a member of the plurality of capacitors is configured as a DC blocking capacitor, and where the plurality of capacitors provides an effective short circuit at a first RF excitation frequency.

15. The MRI RF coil of claim 14, where the second PIN diode is connected in parallel with the first capacitor.

16. The MRI RF coil of claim 8, where the decoupling circuit further comprises a first choke connected in series between the DC bias source and the first node.

17. The MRI RF coil of claim 16, where the decoupling circuit further comprises a second choke connected in series between the second node and the DC bias drain.

18. A circuit for actively decoupling or passively decoupling a radio frequency (RF) coil used in a magnetic resonance imaging (MRI) system, the RF coil comprising at least one series capacitor, the circuit comprising:
    a pair of fast switching PIN diodes comprising a first fast switching PIN diode connected antiparallel with a second, different fast switching PIN diode, where the first fast switching diode has a carrier life time of 100 ns or less, and where the second fast switching diode has a carrier life time of 100 ns or less;

a first DC blocking capacitor, where the first blocking capacitor is connected in series with the second fast switching PIN diode, or where the first DC blocking capacitor is connected in parallel with the second fast switching PIN diode; and a decoupling inductor connected in series with the first DC blocking capacitor and the pair of fast switching PIN diodes, where the circuit is connected in parallel with the at least one series capacitor, where the circuit actively decouples the RF coil upon injection of a DC bias into the circuit, and where the circuit passively decouples the RF coil upon generation of an induced voltage in the circuit.

19. The circuit of claim 18, where the RF coil is a receive coil, a transmit coil, or a transmit and receive coil.

20. The circuit of claim 18, where the RF coil is a birdcage coil, a saddle coil, a loop coil, a plurality of birdcage coils, a plurality of saddle coils, or a plurality of loop coils.

21. The circuit of claim 18, where the decoupling inductor resonates in parallel with the at least one series capacitor when subjected to an NMR frequency.

22. The circuit of claim 18, the circuit further comprising:
   a DC bias source operably connected to a first node located between the first DC blocking capacitor and the second fast switching PIN diode; and
   a DC bias drain operably connected to a second node located between the decoupling inductor and the first fast switching PIN diode.

23. A magnetic resonance imaging (MRI) apparatus comprising:
   a controller;
   a radio frequency (RF) coil operably connected to the controller, where the RF coil comprises an LC circuit comprising at least one series capacitor, where the RF coil participates in the acquisition of MR data by transmitting RF signals into an examination subject or by receiving MR signals from the examination subject, where the controller provides the RF coil with a current, a voltage, or a control signal that causes the RF coil to resonate at a desired transmission frequency; and
   a decoupling circuit connected in parallel to the RF coil, where the decoupling circuit actively decouples, upon injection of a DC bias into the decoupling circuit, or passively decouples, upon generation of an induced voltage in the decoupling circuit, the RF coil from one or more other RF coils associated with the MRI apparatus,
      where the decoupling circuit comprises one or more conductors, a pair of PIN diodes, at least one capacitor, and an inductor,
      where the pair of PIN diodes includes a first fast-switching PIN diode connected antiparallel to a second fast-switching PIN diode,
      where the at least one capacitor is a DC blocking capacitor connected in series or connected in parallel with the second fast-switching PIN diode, and
      where the inductor is connected in series with the at least one capacitor and the pair of PIN diodes.

24. The apparatus of claim 23, where the first fast-switching PIN diode and the second fast-switching PIN diode have a diode carrier life time equal to or less than 100 ns.

25. A magnetic resonance imaging (MRI) radio frequency (RF) transmit/receive coil comprising:
   a receive element;
   a transmit element operably connected to the receive element; and
   a decoupling circuit operably connected to the transmit element or the receive element, where the decoupling circuit actively decouples the transmit element from the receive element upon injection of a DC bias into the decoupling circuit, where the decoupling circuit passively decouples the receive element from the transmit element upon the production of an induced voltage in the decoupling circuit, the decoupling circuit comprising:
      a first fast switching PIN diode connected antiparallel with a second fast switching PIN diode; and
      at least one DC blocking capacitor connected in series or connected in parallel with the second fast switching PIN diode.

* * * * *